(12) United States Patent
Han et al.

(10) Patent No.: US 7,338,823 B2
(45) Date of Patent: Mar. 4, 2008

(54) SIDE-EMITTING LED PACKAGE AND MANUFACTURING METHOD OF THE SAME

(75) Inventors: Kyung Taeg Han, Kyungki-do (KR); Hun Joo Hahm, Kyungki-do (KR); Dae Yeon Kim, Kyungki-do (KR); Ho Sik Ahn, Kyungki-do (KR); Seong Yeon Han, Kyungki-do (KR); Young Sam Park, Seoul (KR); Seon Goo Lee, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/444,397

(22) Filed: Jun. 1, 2006

(65) Prior Publication Data
US 2006/0284203 A1 Dec. 21, 2006

(30) Foreign Application Priority Data
Jun. 1, 2005 (KR) .................... 10-2005-0046796

(51) Int. Cl.
*H01L 21/00* (2006.01)
*H01L 21/48* (2006.01)

(52) U.S. Cl. .................... 438/29; 438/26; 438/113; 438/116; 257/E33.072; 257/E33.059

(58) Field of Classification Search ............. 438/106, 438/22, 29, 25, 26, 113, 116
See application file for complete search history.

(56) References Cited

U.S. PATENT DOCUMENTS

| | | | |
|---|---|---|---|
| 6,345,903 B1* | 2/2002 | Koike et al. ................. | 362/249 |
| 6,638,780 B2* | 10/2003 | Fukasawa et al. ............ | 438/26 |
| 6,674,096 B2 | 1/2004 | Sommers | |
| 6,945,672 B2* | 9/2005 | Du et al. ..................... | 362/241 |
| 2005/0151142 A1* | 7/2005 | Imai ............................ | 257/81 |

FOREIGN PATENT DOCUMENTS

| | | |
|---|---|---|
| JP | 09-083019 A | 3/1997 |
| JP | 10-125959 | 5/1998 |

* cited by examiner

*Primary Examiner*—Michael Trinh
(74) *Attorney, Agent, or Firm*—McDermott Will & Emery LLP

(57) ABSTRACT

The invention relates to a side-emitting LED package and a manufacturing method of the same. The invention provides a side-emitting LED package for emitting light from a light source sideward including a substrate with an electrode formed thereon. The package also includes a light source disposed on the substrate, a molded part that covers and protects the substrate with the light source thereon, and a reflective layer that covers an outer surface of the molded part. The molded part with the reflective layer forms a light transmitting surface in one side thereof. The invention allows easy manufacture of a reflecting surface in a desired shape, miniaturization regardless of the LED chip size, mass-production in an LED array, significantly improving productivity.

8 Claims, 9 Drawing Sheets

(a)

(b)

(a)

(b)

(a)

(b)

SIDE-EMITTING LED PACKAGE AND MANUFACTURING METHOD OF THE SAME

CLAIM OF PRIORITY

This application claims the benefit of Korean Patent Application No. 2005-46796 filed on Jun. 1, 2005, in the Korean Intellectual Property Office, the disclosure of which is incorporated herein by reference.

BACKGROUND OF THE INVENTION

1. Field of the Invention

The present invention relates to a side-emitting LED package for emitting light from one side thereof, and a manufacturing method of the same. More particularly, the invention relates to a side-emitting LED package which has a reflecting surface easily manufactured in a desired form, can be mass-produced in a compact size regardless of an LED chip size, and can easily be adapted to have an LED array inside thereof, thereby significantly improving productivity, and a manufacturing method of the same.

2. Description of the Related Art

In general, a backlight such as used in a mobile phone or a PDA adopts an LED package having a light transmitting surface in one side thereof for its light source.

Such LED packages are becoming slimmer as the mobile phones are becoming slimmer nowadays.

Aside-emitting LED package 200 illustrated in FIG. 1(a) is a structure, in which a molded body 210 covers a lead frame having an LED chip therein, and thus its thickness is limited to be about 0.5 T. Therefore, such a method is limited in reducing the thickness.

FIG. 1(b) illustrates another structure of LED package 230. In this conventional technology, an LED chip 234 is mounted on a substrate 232, which is covered by a molded body 236 having a cavity therein bonded to the substrate 232. Then, a solution of phosphor and epoxy mixed together is injected and cured in the cavity, and diced afterwards. This conventional method, however, entails a complicated process, and thus is not efficient in terms of productivity.

FIG. 2(a) illustrates another conventional side-emitting LED package 250. This conventional structure is taught in Japanese Patent Application Publication 1997-83019, in which an LED is used for a light source 252, and light from the LED is induced toward one side of the package to be emitted out of the package.

In this conventional structure, an outer surface of the light source 252 is wrapped with a lens, and a retainer 256 wraps around the lens 254. The retainer 256 has an opening in one side to form a light transmitting surface 256a, and a reflecting surface 258 is formed on the opposite side of the light transmitting surface 258 inside the retainer 256.

This conventional structure also, however, entails a complicated and cumbersome manufacturing process, in which the retainer 256 and the reflecting surface 258 should be prepared separately to wrap around the lens 254.

In addition, FIG. 2(b) illustrates another LED package 270, which is disclosed in U.S. Pat. No. 6,674,096 granted to Sommers, Mathew L. In this structure, a molded part 274 wraps around an LED chip 272, and has a centrally depressed reflecting surface 276 on an upper surface thereof. The reflecting surface 276 has a reflective layer 278 formed thereon to form a light transmitting surface around the sides of the molded part 274. However, this conventional technology also bears a problem in that the light transmitting surface 280 is not formed in one particular direction, and thus the reflected light is not focused but tends to be scattered.

SUMMARY OF THE INVENTION

The present invention has been made to solve the foregoing problems of the prior art and it is therefore an object of the present invention to provide a side-emitting LED package which does not additionally require an injection-molded material and thus can have minimal thickness, and a manufacturing method of the same.

It is another object to provide a PCB type side-emitting LED package having a reflecting surface that can easily be manufactured in a desired shape, which can be mass-produced, and a manufacturing method of the same.

It is further another object to provide a side-emitting LED package which can be mass-produced and is not affected by an LED chip size, and can have an LED array inside thereof, and a manufacturing method of the same.

It is yet another object to provide a side-emitting LED package which adopts Epoxy Molding Compound (EMC) transfer molding to minimize color dispersion, and a manufacturing method of the same.

According to an aspect of the invention for realizing the object, there is provided a side-emitting LED package for emitting light from a light source sideward, including: a substrate with an electrode formed thereon; a light source electrically connected to the electrode and disposed on the substrate; a molded part covering and protecting the substrate and the light source disposed on the substrate; a reflective layer covering an outer surface of the molded part; and a light transmitting surface formed in one side of the package with respect to a plane where the light source is disposed.

According to another aspect of the invention for realizing the object, there is provided a A manufacturing method of an LED package for emitting light from a light source sideward, the method comprising steps of: (i) providing a substrate with electrodes formed thereon; (ii) disposing light sources on the substrate; (iii) forming a molded part on the substrate and the light sources disposed on the substrate; (iv) dicing the molded part to divide into individual packaging parts;(v) forming a reflective layer covering an outer surface of the molded part; and (vi) dicing one side of the molded part and the reflective layer to form a light transmitting surface in one side.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
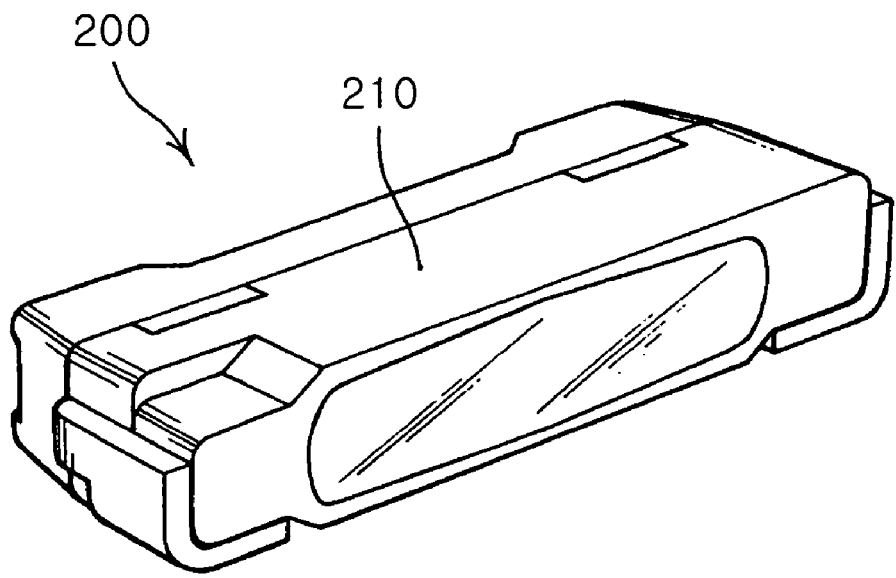
FIG. 1 illustrates side-emitting LED packages according to the prior art, in which, (a) is a structure including a molded body, and (b) is a structure including a printed circuit board and a molded body.
Figure 1:
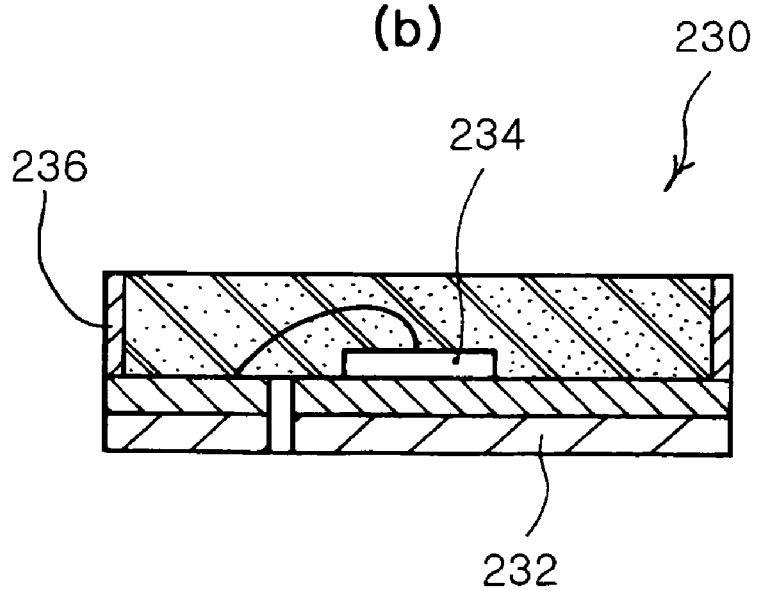
Figure 2:
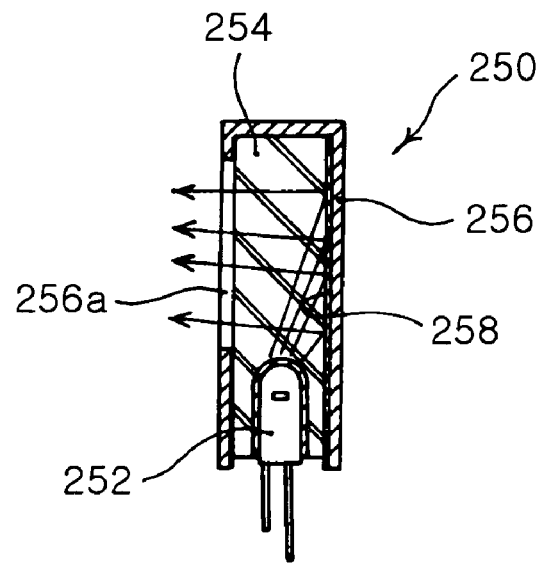
FIG. 2 illustrates other side-emitting LED packages according to the prior art, in which, (a) is a structure including a lens, a reflecting surface and a retainer, and (b) is a structure including a reflecting surface and a reflective layer that are centrally depressed.
Figure 2:
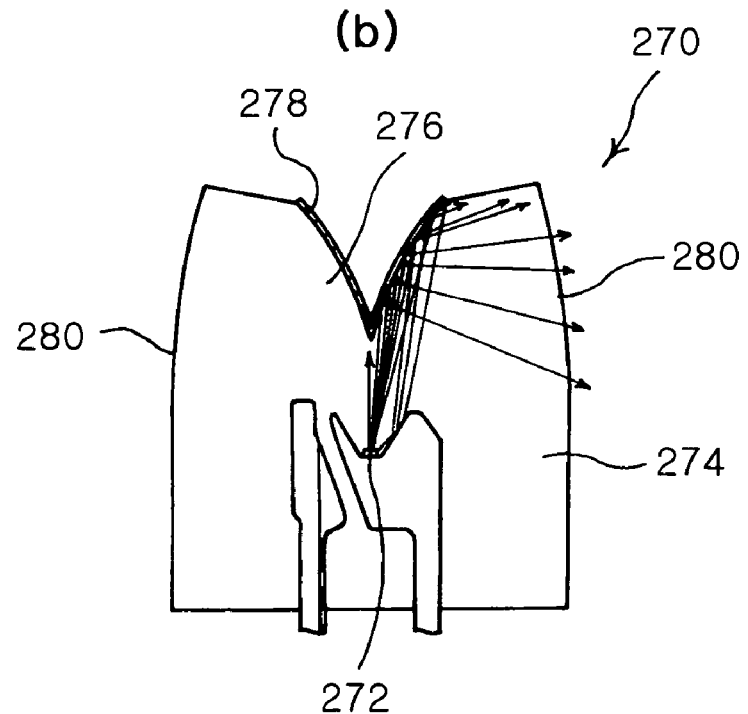
Figure 3:
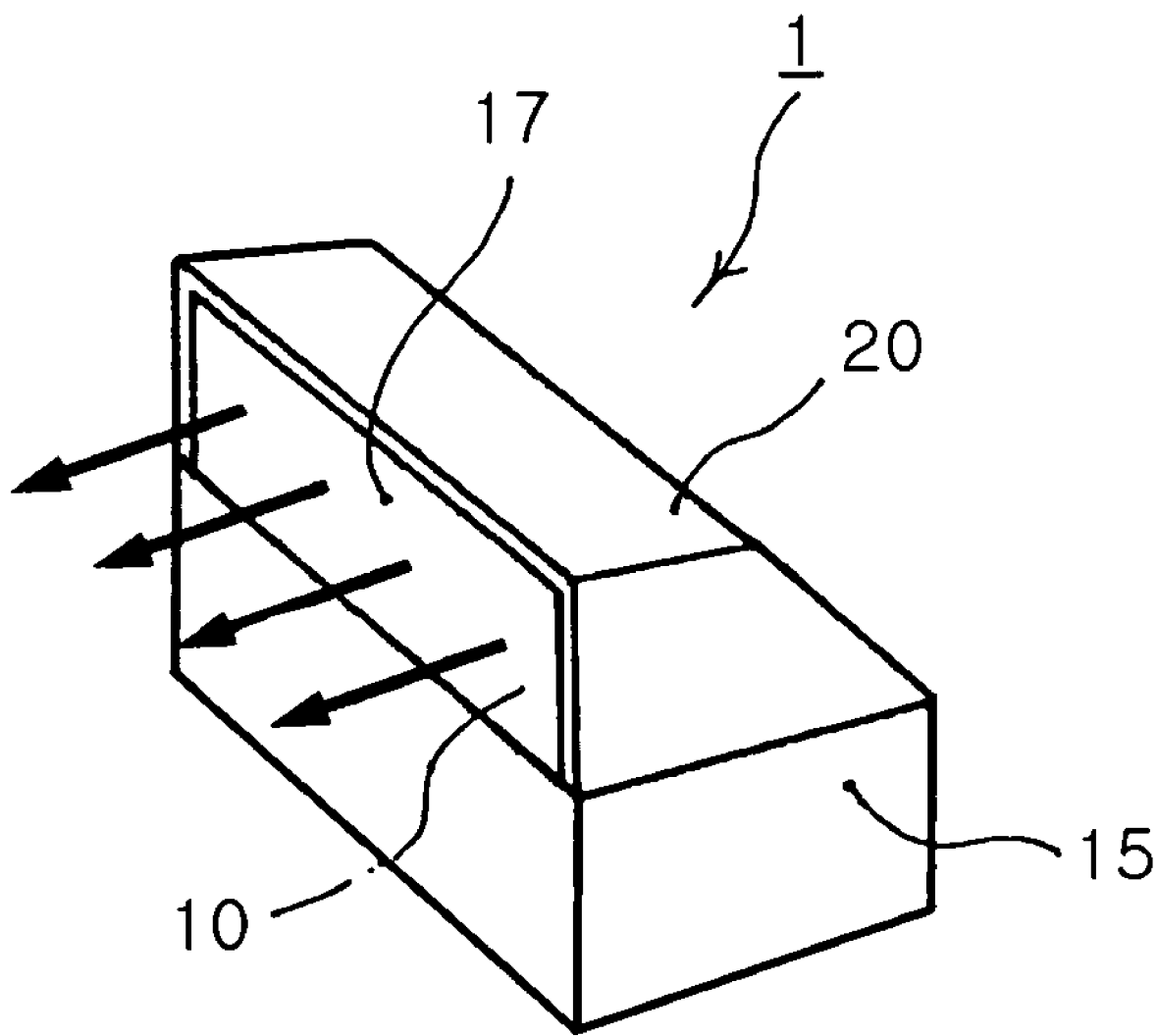
FIG. 3 is a perspective view illustrating a side-emitting LED package according to the present invention.
Figure 4:
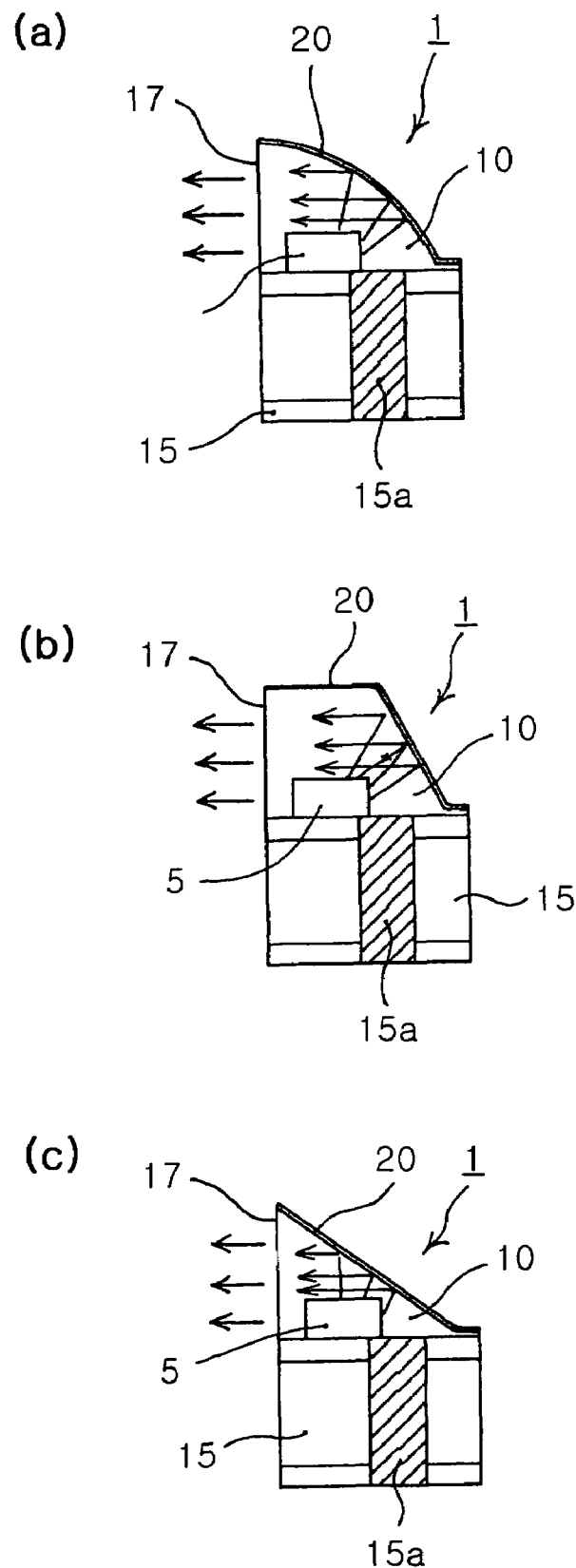
FIG. 4 is a sectional view illustrating embodiments of the side-emitting LED package according to the present invention, in which (a) illustrates a reflective layer in a curved surface, (b) illustrates a reflective layer in a horizontal planar top surface with a sloped planar side surface, and (c) illustrates a reflective layer in a sloped planar surface.
Figure 5:
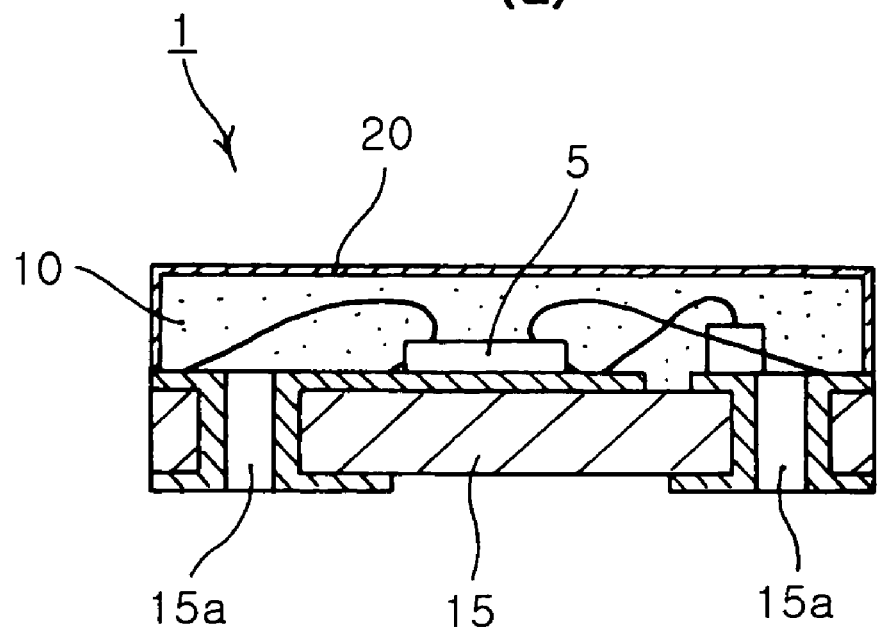
FIG. 5 is a sectional view illustrating the side-emitting LED package according to the present invention, in which (a) is a structure having one LED chip as a light source, and (b) is a structure having a plurality of LED chips as a light source.
Figure 5:
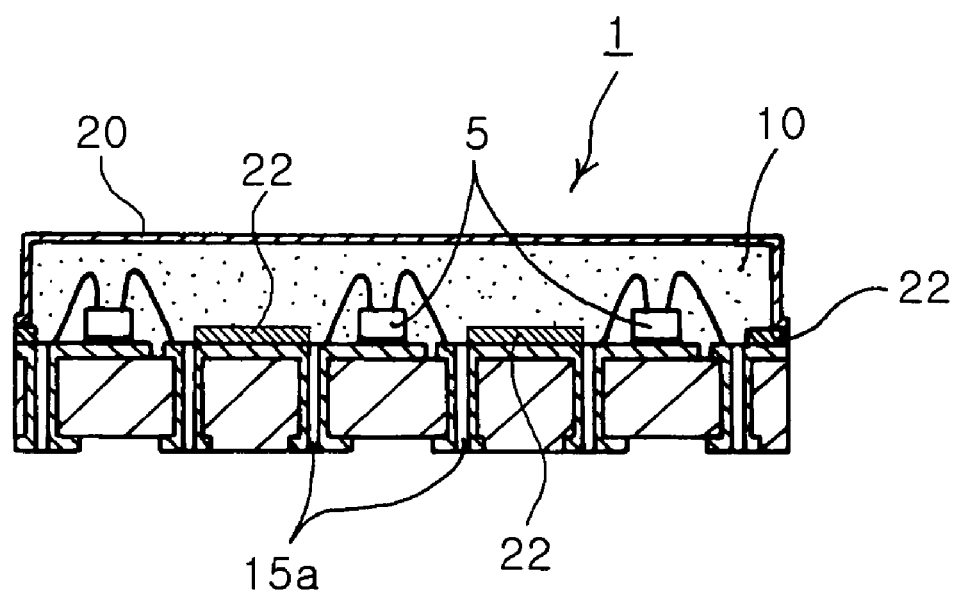

Referring to FIGS. 3 to 5, a side-emitting LED package 1 according to the present invention is designed to emit light from an LED chip or a light source 5 to one side. The direction of light emission preferably forms a right angle with a plane where the LED chip is mounted.

The side-emitting LED package 1 according to the present invention has a substrate 15 with electrodes 15a formed thereon. The substrate 15 is preferably a printed circuit board (PCB) or a ceramic substrate having patterned electrodes (not shown) or the electrodes 15a formed as vertical electrodes such as vias.

In addition, the LED chip as the light source 5 is disposed on the substrate 15 and electrically connected to the electrodes 15a. Either a horizontal type of LED chip having electric terminals formed only on an upper surface thereof or a vertical type of LED chip having electric terminals formed on upper and lower surfaces thereof is applicable in the present invention.

In addition, a molded part 10 is formed to cover the substrate 15 with the light source 5 disposed thereon. The molded part 10 is formed by curing resin, etc., and preferably made of transparent Epoxy Molding Compound (EMC) containing phosphor to minimize color dispersion.

Various forms of mold (not shown) can be used in the process of forming the molded part 10. For example, as shown in FIG. 4(a), the molded part 10 can have a curved surface, or as shown in FIG. 4(b), can have a horizontal planar top surface with a sloped planar side surface opposed to a light transmitting surface 17, or as shown in FIG. 4(c), can have a sloped planar surface. The desired shape of the molded part 10 as described can be obtained by machining the mold in advance according to the desired structure of the molded part 10.

When the molded part 10 is formed as just described, it is machined according to the desired shape for each package.

When the molded part 10 is completed in a desired form as described above, a reflective layer 20 is formed thereon with the light transmitting surface 17 formed on one particular surface thereof.

The reflective layer 20 can be formed by depositing metal selected from a group consisting of Al, Au, Ag, Ni, W, Ti and Pt or attaching a thin film directly on an outer surface of the molded part 10. Alternatively, if an electrode (not shown) for plating is formed on the substrate 15, the reflective layer 20 can be formed by plating. The reflective layer 20 completely wraps the molded part 10 to prevent light from leaking so that light is emitted only through the light transmitting surface 17 formed on one side of the molded part 10.

Therefore, in the same fashion as the molded part 10, the reflective layer 20 may be a curved surface, a horizontal planar top surface with a sloped planar side surface opposed to the light transmitting surface 17, and a sloped planar surface.

The light transmitting surface 17 preferably forms a right angle with the LED chip forming the light source 5 or with a planar surface of the substrate 15 where the LED chip is mounted. In addition, the light transmitting surface 17 is preferably composed of a single planar surface so that light is emitted with a specific directivity through one particular side.

Alternatively, the light transmitting surface 17 can be composed of a plurality of planar surfaces or a curved surface having a predetermined curvature.

As shown in FIG. 5(a), in the side-emitting LED package 1 according to the present invention, at least one LED chip is disposed inside the molded part 10 to form the light source 5. That is, as shown in FIG. 5(b), the light source 5 may be composed of one LED chip or a plurality of LED chips in accordance with optical requirements.

In case of a plurality of LED chips forming a single light source 5, solder resistors 22 are formed between the LED chips on the substrate 15 to electrically insulate the reflective layer from the electrodes 15a.

A manufacturing method of a side-emitting LED package according to the present invention will be explained in detail hereunder.

Figure 6A:
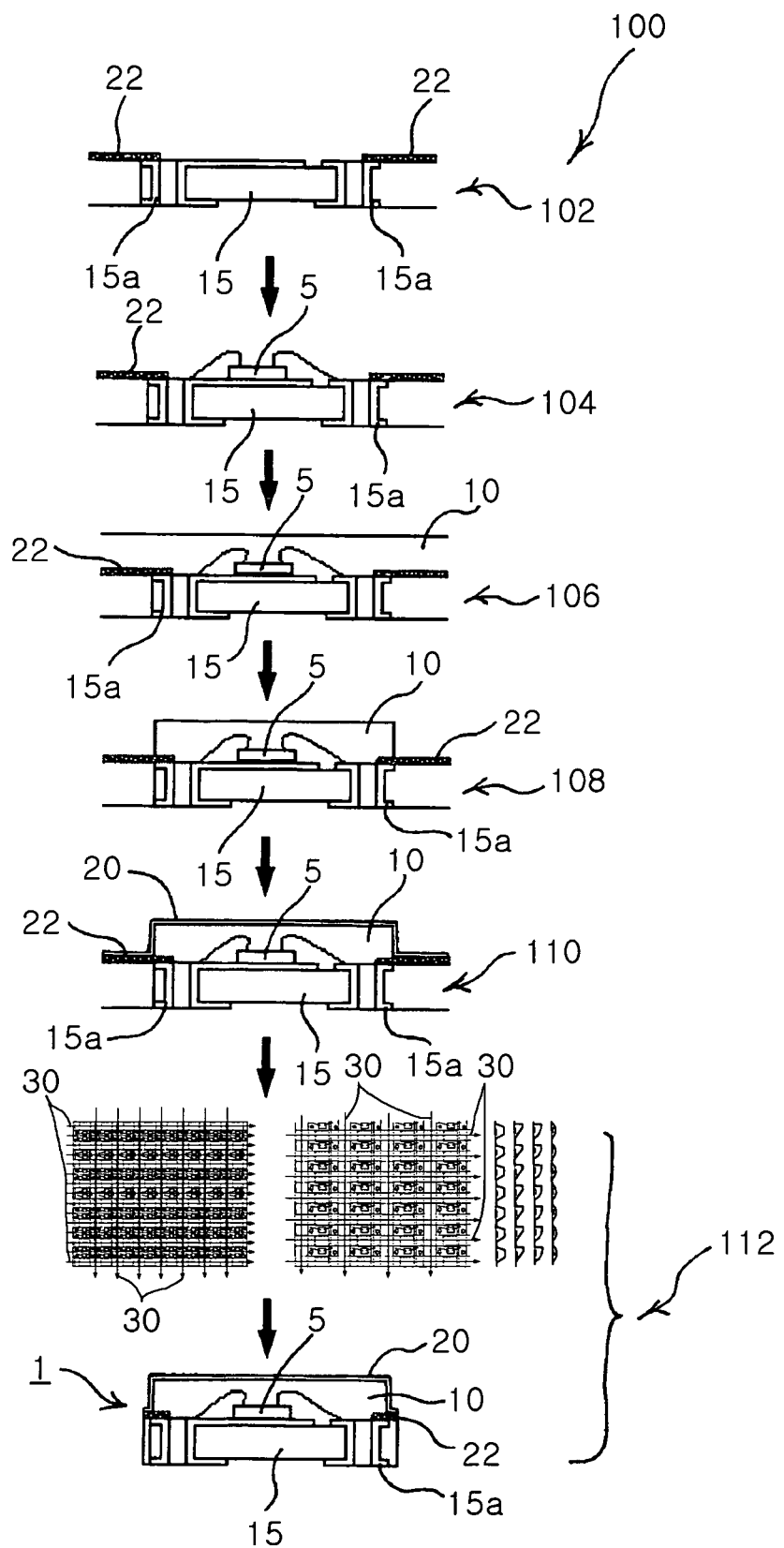
FIG. 6a illustrates a manufacturing method of the side-emitting LED package having one LED chip as a light source.
Figure 6B:
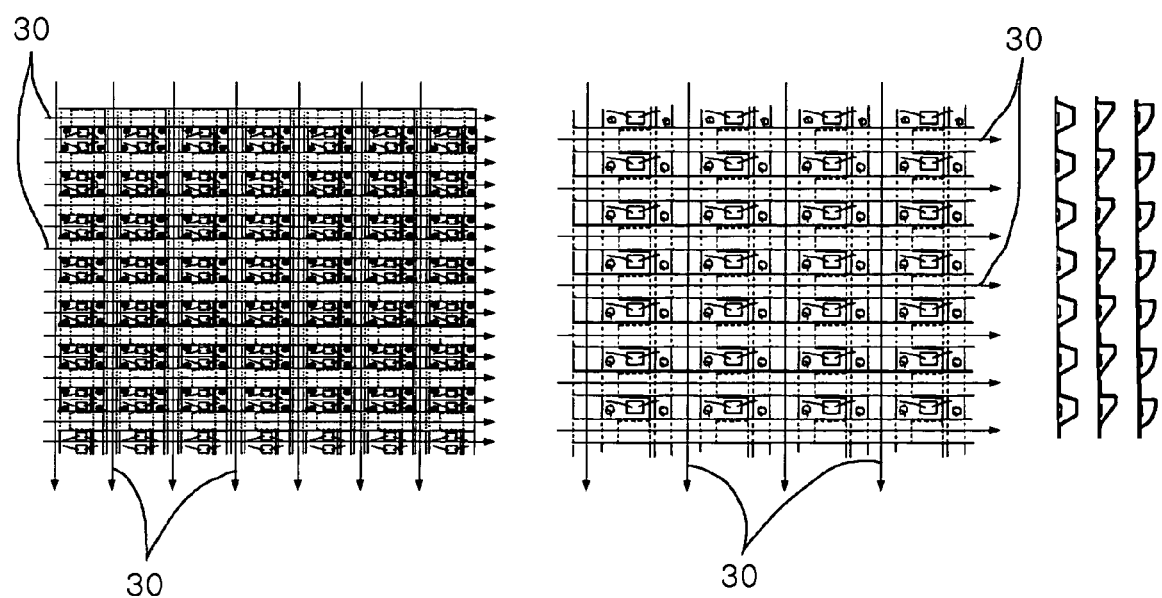
FIG. 6b is a detailed view of the manufacturing method of the side emitting LED package shown in FIG. 6a, with magnified dicing lines.

As shown in FIG. 6, the manufacturing method 100 of the side-emitting LED package according to the present invention starts with a step 102 of providing a substrate 15 with electrodes 15a formed thereon. On the substrate 15, solder resistors 22, which will be explained later, are formed between LED chips.

In this step 102, the substrate 15 may be a printed circuit board (PCB) or a ceramic substrate having the electrodes 15a as vertical electrodes 15a such as vias or patterned electrodes (not shown). The electrodes 15a such as vias are formed in each area where the LED chip is disposed to form a light source 5. When needed, an additional patterned electrode can be formed to connect the vias with the light source 5.

The next step 104 is disposing a plurality of light sources on the substrate 15.

In this step 104, a plurality of LED chips are simultaneously mounted on a single substrate 15 to form the light sources 5 and electrically connected to the electrodes 15a of the substrate 15.

In the next step 106, a molded part 10 is formed on the substrate 15 with the light sources 5.

In this step 106, the molded part 10 containing phosphor is formed by transfer molding of Epoxy Molding Compound (EMC) to minimize color dispersion once it is cured.

In addition, various forms of mold can be used to form the molded part 10, such as a curved surface, a horizontal planar top surface with a sloped side surface opposed to the light transmitting surface 17 and a sloped planar surface, as explained with reference to FIG. 4.

After the molded part 10 is formed as described, it is diced in the next step 108.

In this step 108, only the molded part 10 is diced or etched to form a desired shape of molded part 10 for packaging each LED chip that forms each light source 5. In this step 108, the molded part 10 is diced or etched such that its peripheral end portions partially cover the solder resistors 22 on the substrate 15.

In the next step 110, a reflective layer 20 is formed to cover an outer surface of the molded part 10. The reflective layer 20 can be formed by depositing metal having high reflectivity selected from a group consisting of, for example, Al, Au, Ag, Ni, W, Ti and Pt on the molded part 10, or attaching a high reflectivity film on the molded part 10. Here, it is preferable that the reflective layer 20 completely covers an outer surface of the molded part 10 to prevent leaking of light to the outside.

In addition, the manufacturing method of the present invention includes the last step 112, in which a side of the molded part 10 and the reflective layer 20 is diced to form a light transmitting surface 17.

In this step 112 of forming the light transmitting surface 17, a side of the molded part 10 and the reflective layer 20 is diced simultaneously so that the entire outer surface of the molded part 10 except the portion of the light transmitting surface 17 is covered by the reflective layer 20.

Here, the peripheral end portions of the reflective layer 20 partially cover the solder resistors 22 on the substrate 15 to ensure electrical insulation between the reflective layer 20 and the electrodes 15a.

In addition, the above step 112 includes cutting the substrate 15 along horizontal and vertical cutting lines 30 into individual LED packages.

Figure 7A:
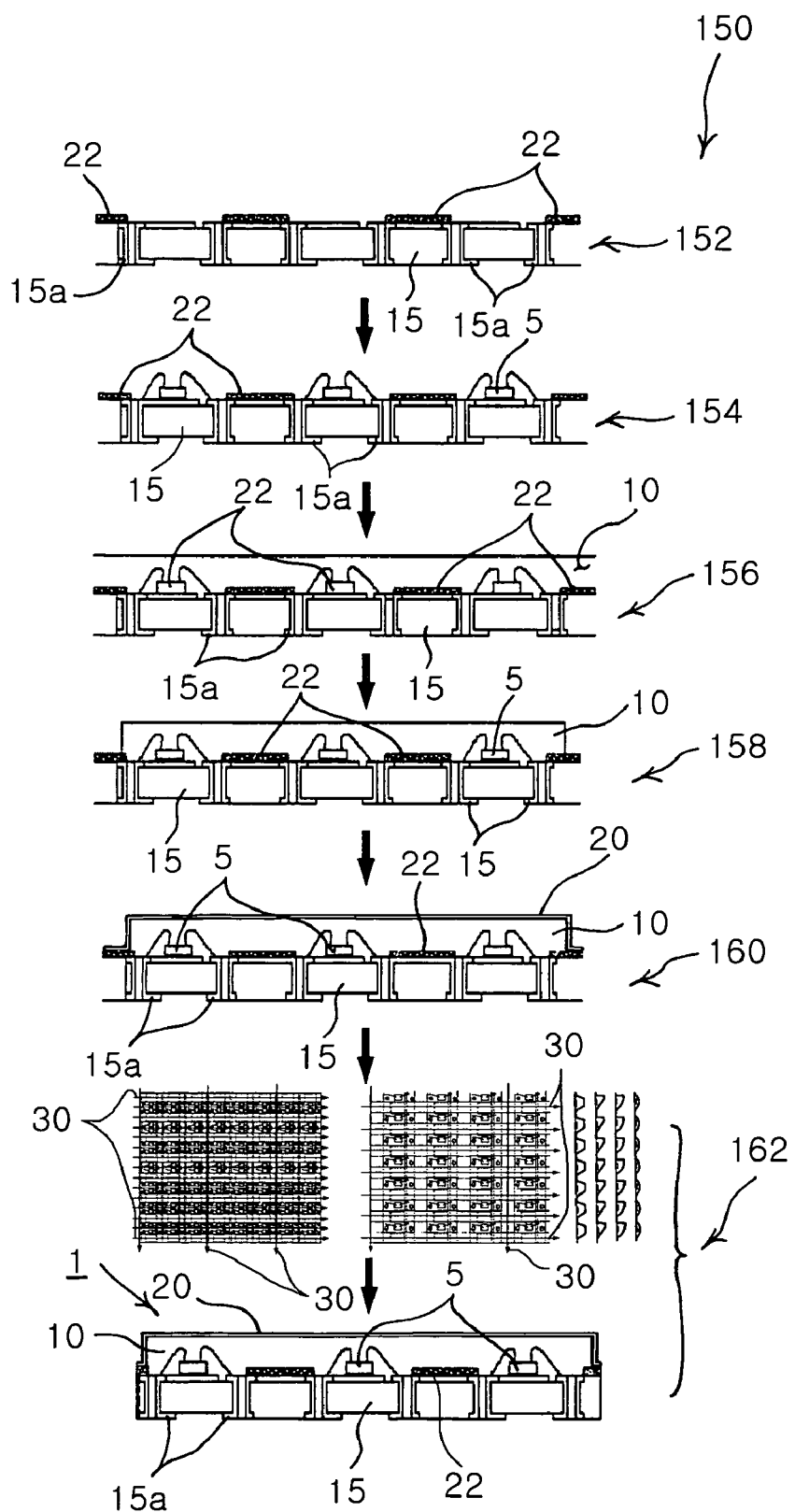
FIG. 7a illustrates a manufacturing method of the side-emitting LED package having a plurality of LED chips as a light source.
Figure 7B:
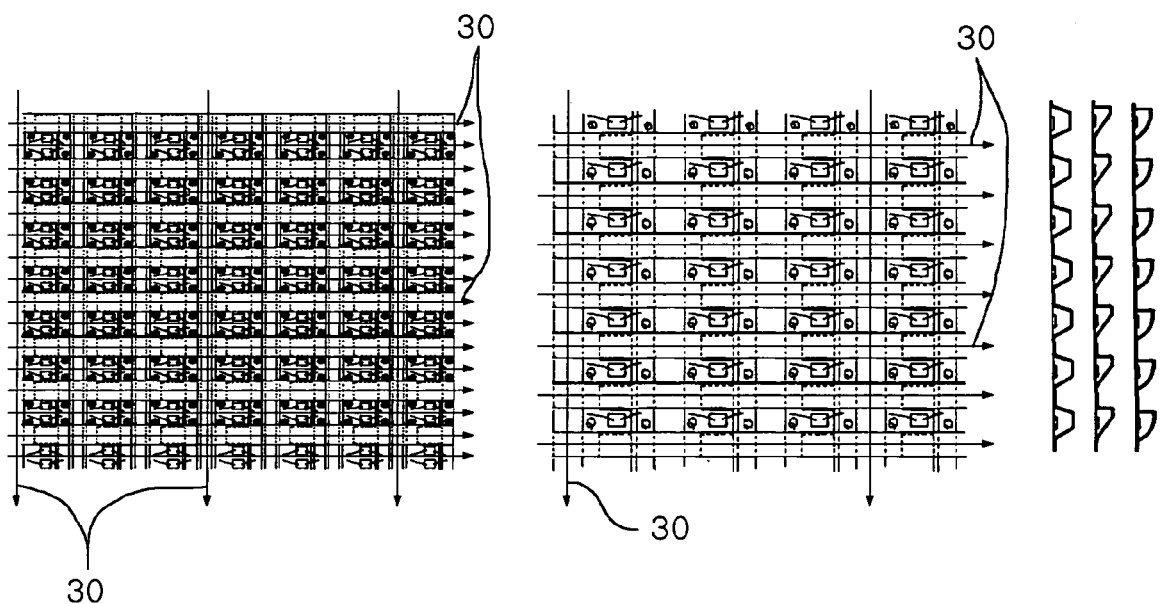
FIG. 7b is a detailed view of the manufacturing method shown in FIG. 7a with magnified dicing lines.

FIG. 7 illustrates step-by-step a manufacturing method 150 of a side-emitting LED package having a light source 5 comprising a plurality of LED chips disposed inside a single molded part 10 with a reflective layer 20 thereon.

The manufacturing method 150 of a side-emitting LED package according to the present invention starts with providing a substrate 15 with electrodes 15a formed thereon, as explained with reference to FIG. 6.

In each area where an LED chip will be disposed later on the substrate 15 to form a light source 5, solder resistors 22 are formed to electrically insulate the electrodes 15a in this area from other parts. A plurality of vias are formed to provide the electrodes 15a.

In the next step 154, the LED chips are disposed on the substrate 15 to form a light source 5, and wires are installed to connect the LED chips to the electrodes 15a.

In the next step 156, a molded part 10 is formed covering the substrate and the light source 5 disposed on the substrate. The molded part 10 is made of transparent Epoxy Molding Compound (EMC).

Once the molded part 10 is completed as described, it is diced in the next step 158.

In this step 158, the molded part 10 is diced into a plurality of packaging parts such that a desired number of LED chips form a single light source 5 inside a single molded part 10 or a single packaging part. In this step 158, peripheral end portions of the molded part 10 partially cover the solder resistors 22 on the substrate 15.

The solder resistors 22 block electrical connection between the-electrodes 15a and the reflective layer 20, which will be formed later.

In the next step 160, as explained with reference to FIG. 6, metal having high reflectivity, for example, Al, Au, Ag, Ni, W, Ti and Pt, is deposited or plated on an outer surface of the molded part 10, or a high reflectivity film is attached on the molded part 10. Lastly, in the step 162, a side of the molded part 10 and the reflective layer 20 is diced to form a light transmitting surface 17 on one side of thereof.

When the reflective layer 20 is formed as described above, the substrate 15 is cut horizontally and vertically to obtain individual side-emitting LED packages 1, each having a plurality of LED chips therein to form a light source 5.

According to the present invention as set forth above, no other molded material is needed in addition to the molded part 10 so that the package has a minimal thickness to be easily applied to various miniaturized electronic devices.

In the present invention, the mold (not shown) is manufactured freely in various forms to obtain various forms of the molded part 10, thereby obtaining a desired form of the reflective layer 20 on the molded part 10.

In addition, the present invention is not restricted by a molded material other than the molded part, resulting in a compact, thin structure. Also, as the light transmitting surface is formed in a side perpendicular with respect to a plane where the LED chip is mounted on, the package can be manufactured in a small thickness regardless of the LED chip size.

In addition, the substrate is processed as a PCB, that is, the processes of mounting, molding and dicing are conducted as a PCB manufacturing process, enabling mass-production in an array type.

Furthermore, the invention adopts the molded part made of transparent Epoxy Molding Compound (EMC) containing phosphor to minimize color dispersion after it is cured, thereby significantly improving optical properties of the package.

The present invention has been described with reference to preferred embodiments of the invention. This invention may, however, be embodied in many different forms and should not be construed as limited to the embodiments set forth herein. While the present invention has been shown and described in connection with the preferred embodiments, it will be apparent to those skilled in the art that modifications and variations can be made without departing from the spirit and scope of the invention as defined by the appended claims.

What is claimed is:

1. A manufacturing method of an LED package for emitting light from a light source sideward, the method comprising steps of:
   (i) providing a substrate with electrodes formed thereon;
   (ii) disposing light sources on the substrate;
   (iii) forming a molded part on the substrate and the light sources disposed on the substrate;
   (iv) dicing the molded part to divide into individual packaging parts;
   (v) forming a reflective layer covering an outer surface of the molded part; and
   (vi) dicing one side of the molded part and the reflective layer to form a light transmitting surface in one side.

2. The side-emitting LED package according to claim 1, wherein the step (i) of providing a substrate comprises forming solder resistors on the substrate between areas where the light sources are to be disposed, thereby to form insulation between the reflective layer and the electrodes.

3. The method according to claim 1, wherein the step (iii) of forming a molded part comprises transfer molding of transparent Epoxy Molding Compound (EMC) containing phosphor.

4. The method according to claim 1, wherein step (v) of forming a reflective layer comprises depositing or plating metal selected from a group consisting of Al, Au, Ag, Ni, W, Ti and Pt.

5. The method according to claim 1, wherein step (v) of forming a reflective layer comprises attaching a high reflectivity film on the molded part.

6. The method according to claim 1, wherein step (vi) of forming a light transmitting surface comprises cutting the molded part such that at least one LED chip is disposed inside the molded part to form a corresponding one of the light sources.

7. The method according to claim 1, wherein step (vi) of forming a light transmitting surface comprises cutting the molded part and the reflective layer in a direction perpendicular to a plane where the light sources are disposed.

8. The method according to claim 7, wherein step (vi) of forming a light transmitting surface includes cutting the substrate into individual LED packages.

* * * * *